United States Patent
Huang et al.

(10) Patent No.: US 8,640,074 B2
(45) Date of Patent: Jan. 28, 2014

(54) DIGITAL CIRCUIT BLOCK HAVING REDUCING SUPPLY VOLTAGE DROP AND METHOD FOR CONSTRUCTING THE SAME

(75) Inventors: Shen-Yu Huang, Hsinchu County (TW); Chih-Ching Lin, Hualien County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 145 days.

(21) Appl. No.: 13/298,315

(22) Filed: Nov. 17, 2011

(65) Prior Publication Data

US 2012/0056488 A1 Mar. 8, 2012

Related U.S. Application Data

(63) Continuation of application No. 12/358,215, filed on Jan. 22, 2009, now abandoned.

(51) Int. Cl.
*G06F 17/50* (2006.01)
*G01R 27/16* (2006.01)
*G01R 31/20* (2006.01)

(52) U.S. Cl.
USPC ........... 716/133; 716/127; 716/136; 716/137; 716/138; 324/686; 324/688; 324/754.01

(58) Field of Classification Search
USPC .......... 716/133, 136, 137, 138; 324/681, 686, 324/688, 754
See application file for complete search history.

(56) References Cited

U.S. PATENT DOCUMENTS

| | | | |
|---|---|---|---|
| 3,569,745 A | 3/1971 | Kardash | |
| 4,404,059 A | 9/1983 | Livshits | |
| 4,937,649 A | 6/1990 | Shiba | |
| 5,298,802 A | 3/1994 | Usami | |
| 5,638,006 A * | 6/1997 | Nariani et al. | ........... 324/762.03 |
| 5,754,476 A * | 5/1998 | Caser et al. | .............. 365/185.29 |
| 6,232,154 B1 | 5/2001 | Reith | |
| 6,330,044 B1 | 12/2001 | Murade | |
| 6,496,021 B2 | 12/2002 | Tartagni | |
| 6,876,208 B2 | 4/2005 | Kunikiyo | |
| 6,898,769 B2 | 5/2005 | Nassif | |
| 6,904,582 B1 | 6/2005 | Rittman | |
| 7,081,765 B2 * | 7/2006 | Miyasaka et al. | .............. 324/671 |
| 7,181,966 B2 * | 2/2007 | Isogai et al. | ............... 73/335.04 |

(Continued)

OTHER PUBLICATIONS

Chao-Hung Lu et al., "On Increasing Signal Integrity with Minimal Decap Insertion in Area-Array SoC Floorplan Design", Design Automation Conference, 2007. ASP-DAC ' 07. Asia and South Pacific, p. 792 & 794, Jan. 23-26, 2007.

*Primary Examiner* — Helen Rossoshek
(74) *Attorney, Agent, or Firm* — Winston Hsu; Scott Margo (57) ABSTRACT

A digital circuit block includes first to fourth conducting segments, a digital logic, first and second conducting layers, and a dielectric layer. The first and second conducting segments are coupled to first and second supply voltages, respectively. The digital logic and dielectric layer are between the first and second conducting segments. The third conducting segment includes a first end electrically connected to the first conducting segment, a second end not electrically connected to the second conducting segment, and a first portion located at the first conducting layer. The fourth conducting segment includes a first end electrically connected to the second conducting segment, a second end not electrically connected to the first conducting segment, and a second portion located at the second conducting layer. The first and second portions and dielectric layer are formed a first capacitive element to reduce the supply voltage drop between the first and second supply voltages.

9 Claims, 5 Drawing Sheets

(56) References Cited

U.S. PATENT DOCUMENTS

| | | | |
|---|---|---|---|
| 7,205,778 B2* | 4/2007 | Yoshida et al. | 324/662 |
| 7,259,593 B2* | 8/2007 | Miyazawa | 326/83 |
| 7,319,341 B1* | 1/2008 | Harms et al. | 324/754.28 |
| 7,545,162 B2* | 6/2009 | Chung | 324/760.01 |
| 7,578,195 B2* | 8/2009 | DeAngelis et al. | 73/718 |
| 7,683,627 B2 | 3/2010 | Tsukuda | |
| 7,730,434 B2 | 6/2010 | Aghababazadeh | |
| 7,741,700 B2 | 6/2010 | Kuroda | |
| 7,935,965 B1* | 5/2011 | Brozek | 257/48 |
| 2005/0024512 A1 | 2/2005 | Moini | |
| 2005/0088189 A1* | 4/2005 | Yanagisawa et al. | 324/754 |
| 2008/0047743 A1 | 2/2008 | Komatsu | |
| 2009/0001369 A1 | 1/2009 | Lin | |
| 2009/0027328 A1 | 1/2009 | Johnson | |
| 2009/0057746 A1 | 3/2009 | Sugll | |
| 2009/0109597 A1 | 4/2009 | Anthony | |
| 2010/0148304 A1 | 6/2010 | Rahim | |
| 2010/0295138 A1 | 11/2010 | Montanya Silvestre | |

* cited by examiner

DIGITAL CIRCUIT BLOCK HAVING REDUCING SUPPLY VOLTAGE DROP AND METHOD FOR CONSTRUCTING THE SAME

CROSS REFERENCE TO RELATED APPLICATIONS

This application is a Continuation application of co-pending U.S. patent application Ser. No. 12/358,215, which was filed on Jan. 22, 2009 and is incorporated herein by reference.

BACKGROUND OF THE INVENTION

The present invention is related to supplying a supply voltage to a digital circuit, and more particularly, to a digital circuit block having reducing supply voltage drop and a method for constructing the same.

Figure 1:
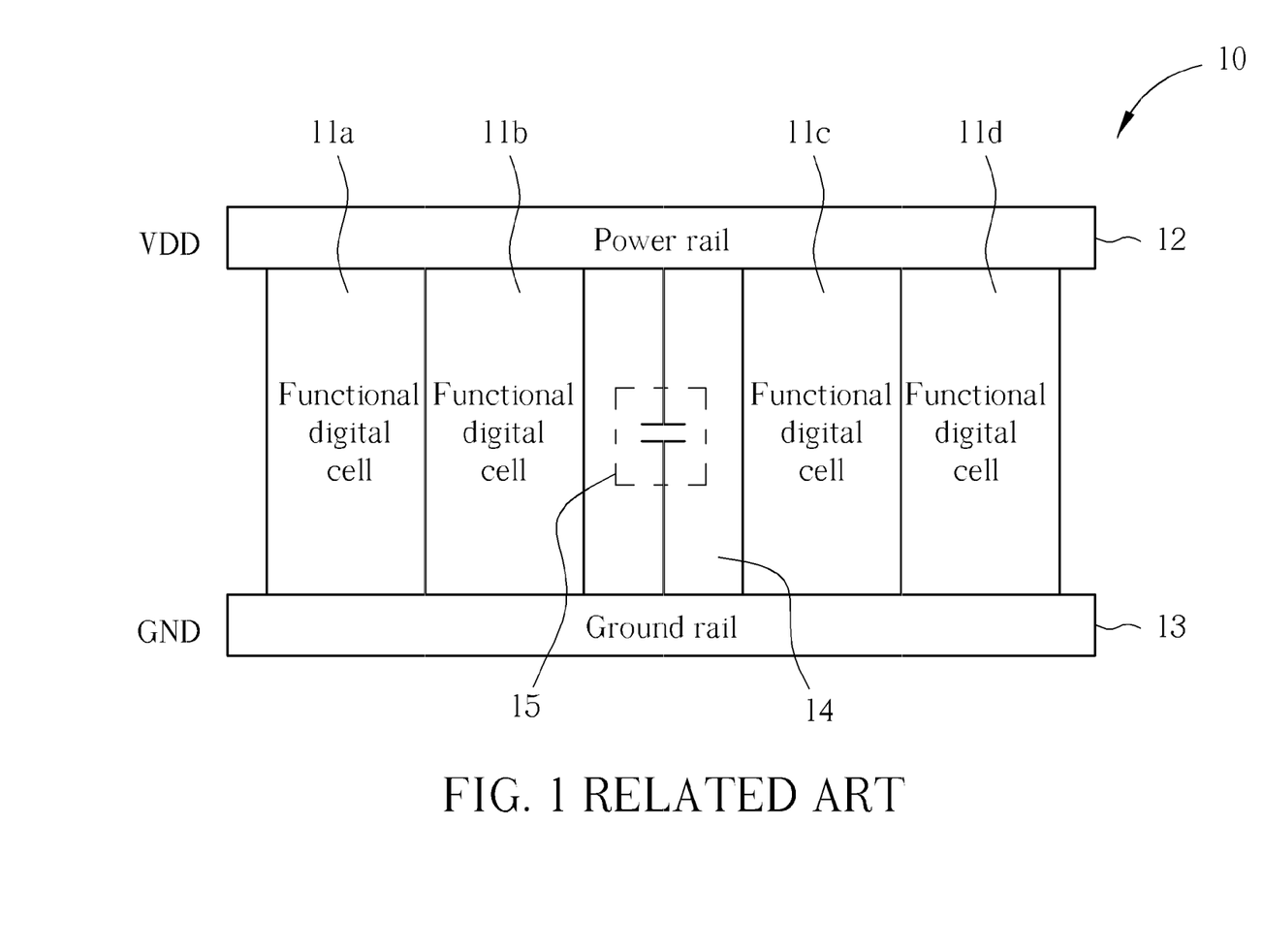
FIG. 1 is a diagram illustrating a prior art digital circuit after performing an APR process.

In the field of digital circuit design, one of the most efficient ways to arrange each of the digital cells within a digital circuit is to perform an automatic placement and routing (APR) process upon the functional digital cells after the digital circuit is designed. Normally, the APR process is performed by software tools. Please refer to FIG. 1. FIG. 1 is a diagram illustrating a prior art digital circuit 10 after performing the APR process. The digital circuit 10 comprises a plurality of functional digital cells 11a~11d, a power rail 12, and a ground rail 13, in which the power rail 12 is coupled to a supply voltage VDD to supply power to each of the functional digital cells 11a~11d, and the ground rail 13 provides a ground voltage GND for the functional digital cells 11a~11d. However, the APR process may generate a gap between some of the two functional digital cells, such as the gap 14 between the functional digital cells 11b and 11c, when optimizing the whole digital circuit 10. If this happens, the gap 14 will be filled up by a filler capacitor 15 in order to stabilize the supply voltage VDD for the functional digital cells 11b and 11c. However, since the filler capacitor 15 is implemented by a CMOS (Complementary Metal Oxide Semiconductor) transistor, and the electric charge of the filler capacitor is accumulated on the gate terminal and the substrate of the CMOS transistor, the electric charge may leak from the gate terminal to the substrate of the CMOS transistor. Therefore, a significant leakage current may be induced if the digital circuit 10 includes a large number of filler capacitors. Accordingly, to reduce the leakage current problem of the digital circuit 10 is becoming one of the most urgent problems in the field of digital circuit design.

SUMMARY OF THE INVENTION

One of the objectives of the present invention is provide a digital circuit block having reducing supply voltage drop and a method for constructing the same.

According to an embodiment of the present invention, a digital circuit block having reducing supply voltage drop is provided. The digital circuit block comprises a first conducting segment having a first end coupled to a first supply voltage; a second conducting segment having a first end coupled to a second supply voltage; a digital logic coupled between a second end of the first conducting segment and a second end of the second conducting segment; a first conducting layer; a second conducting layer, wherein the first conducting layer and the second conducting layer are different depth layers; a dielectric layer being between the first conducting layer and the second conducting layer; a third conducting segment, having a first end electrically connected to the first conducting segment, a second end not electrically connected to the second conducting segment, and a first portion located at the first conducting layer; and a fourth conducting segment, having a first end electrically connected to the second conducting segment, a second end not electrically connected to the first conducting segment, and a second portion located at the second conducting layer; wherein the first portion, the second portion, and the dielectric layer form a first capacitive element to reduce the supply voltage drop between the first supply voltage and the second supply voltage.

According to a second embodiment of the present invention, a method for constructing a digital circuit block having reducing supply voltage drop is provided, wherein the digital circuit block comprises a first conducting segment having a first end coupled to a first supply voltage, a second conducting segment having a first end coupled to a second supply voltage, a digital logic coupled between a second end of the first conducting segment and a second end of the second conducting segment, a first conducting layer, a second conducting layer, and a dielectric layer being between the first conducting layer and the second conducting layer, the method comprising: constructing a third conducting segment having a first end electrically connected to the first conducting segment, a second end not electrically connected to the second conducting segment, and a first portion located at the first conducting layer; wherein the first conducting layer and the second conducting layer are different depth layers; and constructing a fourth conducting segment having a first end electrically connected to the second conducting segment, a second end not electrically connected to the first conducting segment, and a second portion located at the second conducting layer; wherein the first portion, the second portion, and the dielectric layer form a first capacitive element to reduce the supply voltage drop between the first supply voltage and the second supply voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
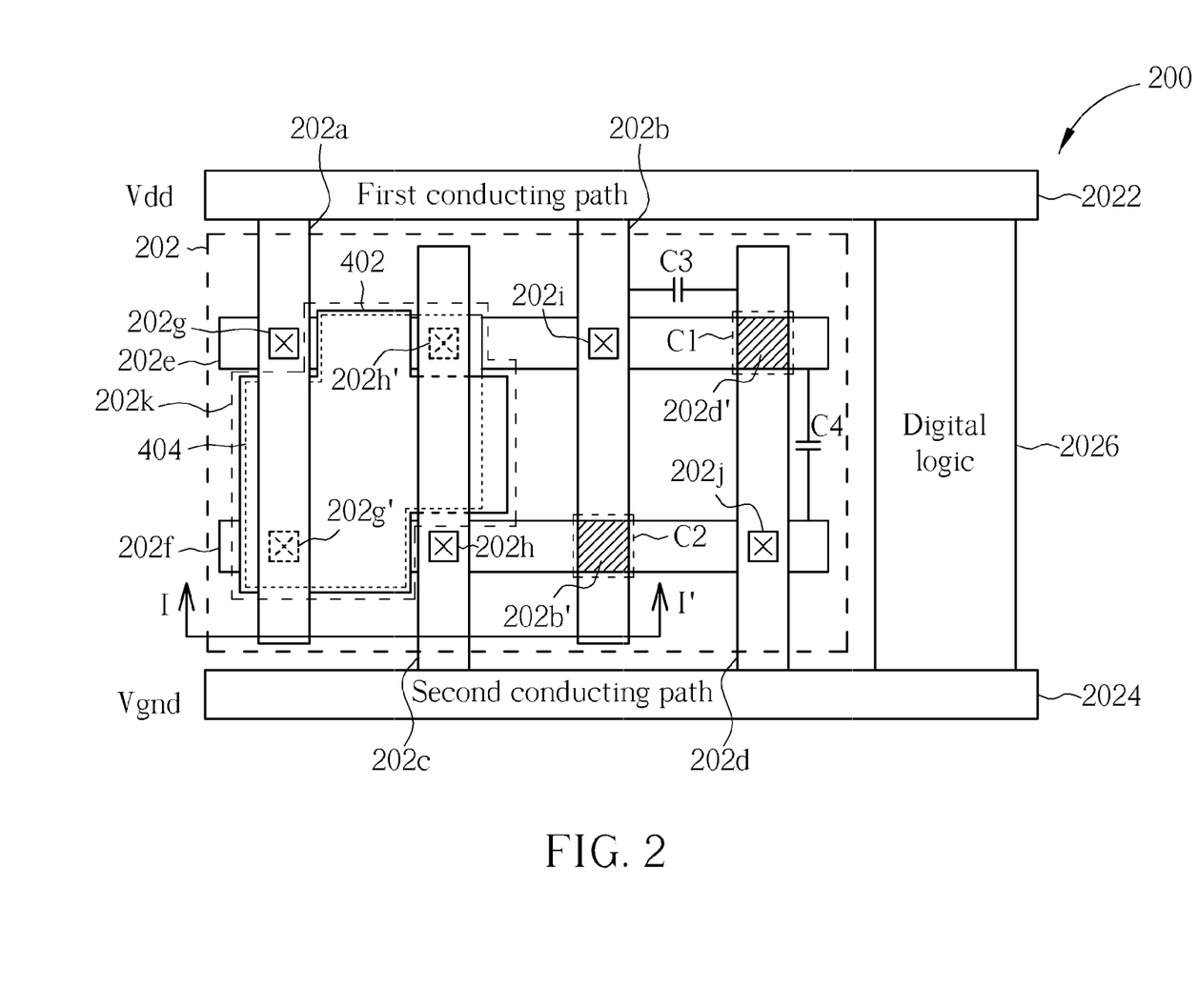
FIG. 2 is a top view diagram illustrating a layout architecture for reducing a supply voltage drop in a digital circuit block according to an embodiment of the present invention.
Figure 3:
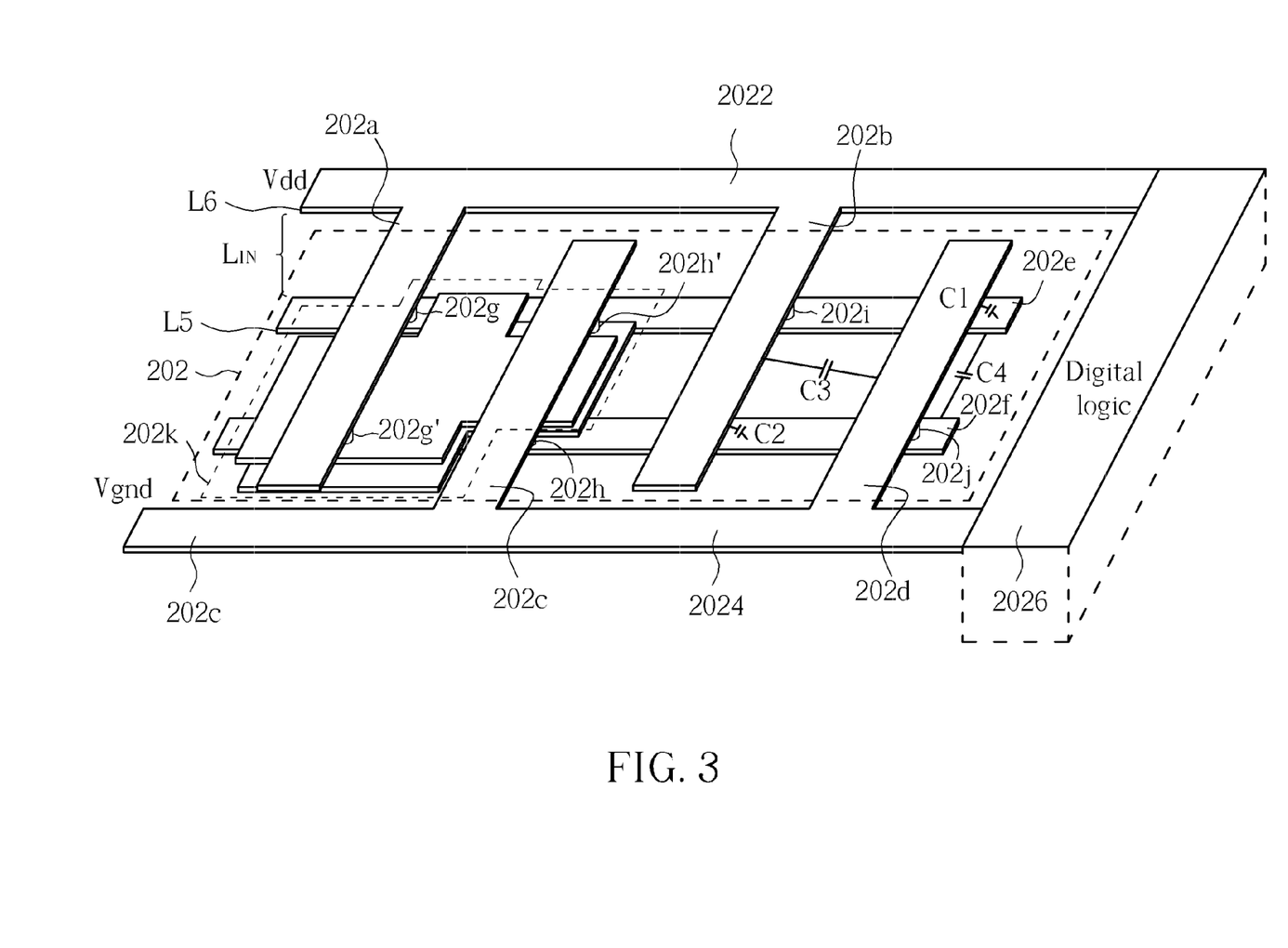
FIG. 3 is a space diagram illustrating the layout architecture of the digital circuit block as shown in FIG. 2.

Please refer to FIG. 2 in conjunction with FIG. 3. FIG. 2 is a top view diagram illustrating a layout architecture 202 for reducing a supply voltage drop in a digital circuit block 200 according to an embodiment of the present invention, wherein the digital circuit block 200 comprises a first conducting path 2022 having a first end coupled to a first supply voltage, such as Vdd, a second conducting path 2024 having a first end coupled to a second supply voltage, such as ground voltage Vgnd, and a digital logic 2026 coupled between a second end of the first conducting path 2022 and a second end of the second conducting path 2024. FIG. 3 is a space diagram illustrating the layout architecture 202 of the digital circuit block 200 as shown in FIG. 2. Please note that, according to the embodiment of the present invention, the layout architecture 202 provides a capacitance block between the first conducting path 2022 and the second conducting path 2024 in order to reduce the supply voltage Vdd IR drop (e.g., dynamic voltage drop) to the digital logic 2026. The layout architecture 202 comprises conducting segments 202a, 202b, 202c, 202d, 202e, 202f, vias 202g, 202h, 202i, 202j, and a metal-dielectric-metal capacitor 202k. The conducting segments 202a, 202b have a first end electrically connected to the first conducting path 2022 and a second end not electrically connected to the second conducting path 2024, and the conducting segments 202c, 202d have a first end electrically connected to the second conducting path 2024 and a second end not electrically connected to the first conducting path 2022.

According to the embodiment of the present invention, the conducting segment 202e coupled to the conducting segments 202a and 202b through the vias 202g and 202i respectively, and the conducting segment 202f coupled to the conducting segments 202c and 202d through the vias 202h and 202j respectively. Furthermore, the metal-dielectric-metal capacitor 202k is constructed under the region between the conducting segments 202a and 202c. Therefore, in this embodiment, the first conducting path 2022, the second conducting path 2024, the conducting segments 202a, 202b, 202c, 202d are located at the same conducting layer L6, such as the top conducting layer (e.g., layer 6) of a semiconductor process; and the conducting segments 202e, 202f are located at the other conducting layer L5, such as layer 5 of the semiconductor process, as shown in FIG. 3. In other words, the layer L6 is adjacent to the layer L5. However, the two conducting layers could also not adjacent to each other. In other words, those skilled in this art are readily to understand that the metal-dielectric-metal capacitor 202k could be implemented between any two conducting layers. Furthermore, a dielectric layer $L_{IN}$ may be between the conducting layer L6 and the conducting layer L5, in which the dielectric layer $L_{IN}$ can be implemented by an oxide layer. Please note that, the layout architecture 202 is just an example of the embodiment of the digital circuit block 200, and is not meant to be a limitation of the present invention. In other words, the number of the conducting segments, vias, and metal-dielectric-metal capacitors and the arrangement between the conducting segments, vias, and metal-dielectric-metal capacitors can be adjusted according to practical conditions, such as the area required by the layout architecture 202, of the implementation of the digital circuit block 200.

Please refer to FIG. 2 again. Since the conducting segments 202b, 202d are located at the conducting layer L6, and the conducting segments 202e, 202f are located at the conducting layer L5, a capacitor C1 may be formed between the overlapped region of the conducting segments 202d and 202e, which is an oblique line portion 202d'; and a capacitor C2 may be formed between the overlapped region of the conducting segments 202b and 202f, which is the oblique line portion 202b'. Furthermore, since the conducting segments 202b and 202d do not electrically contact with each other, a capacitor C3 may be formed between the conducting segments 202b and 202d. Similarly, a capacitor C4 may be formed between the conducting segments 202e and 202f.

Figure 4:
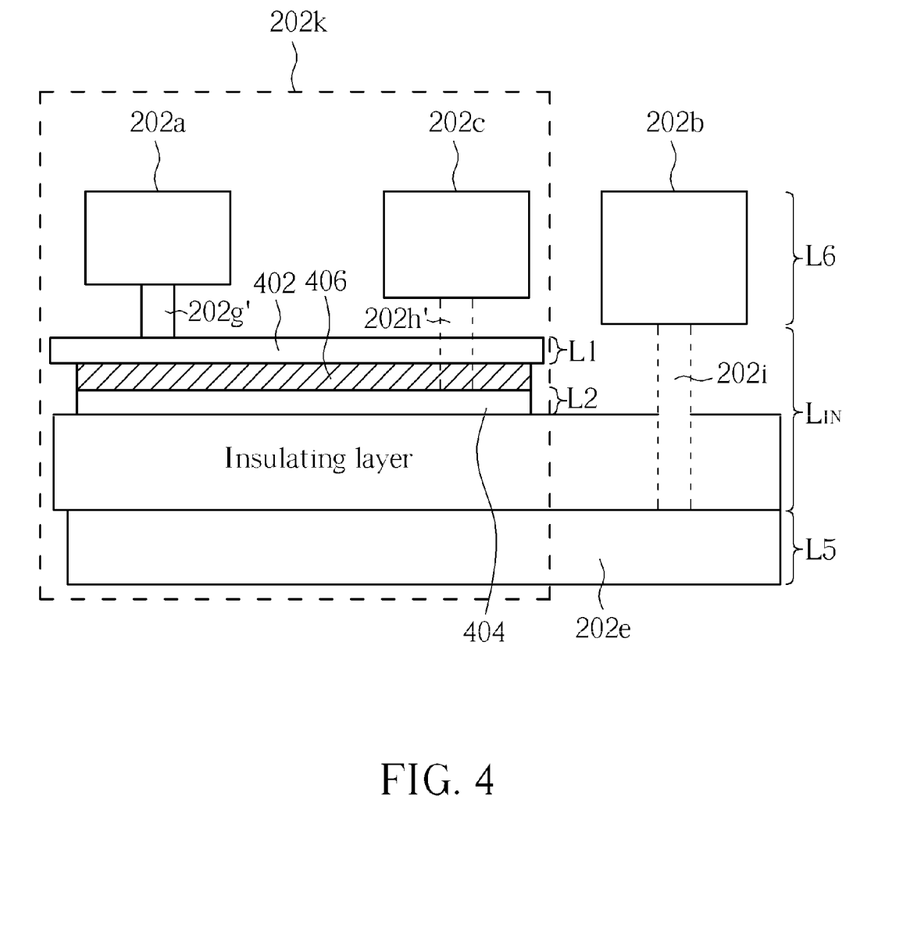
FIG. 4 is a diagram illustrating a side view diagram of a Metal-dielectric-metal capacitor of the digital circuit block as shown in FIG. 2.

Please refer to FIG. 4. FIG. 4 is a diagram illustrating a side view diagram of the metal-dielectric-metal capacitor 202k of the digital circuit block 200 along line I-I' as shown in FIG. 2. Please note that, the via 202h and the capacitor C2 is omitted in the side view diagram of FIG. 4 for the purpose of illustration, and the vias 202h' and 202i illustrated in dotted line represents that the vias 202h' and 202i are in the background from the line I-I' and the via 202g' is in the foreground from the line I-I'. The metal-dielectric-metal capacitor 202k comprises the conducting segment 202a, the conducting segment 202c, a top plate 402, a bottom plate 404, and a dielectric plate 406, in which a third conducting segment of the digital circuit block 200 comprises the conducting segment 202a, the via 202g', and the top plate 402, the top plate 402 may be a first portion of the third conducting segment, wherein the first portion is located at a first conducting layer L1; and a fourth conducting segment of the digital circuit block 200 comprises the conducting segment 202c, the via 202h', and the bottom plate 404, the bottom plate 404 may be a second portion of the fourth conducting segment, wherein the second portion is located at a second conducting layer L2, and the dielectric plate 406 can be implemented by an oxide layer. In addition, the conducting segment 202a is electrically connected with the top plate 402 through the via 202g', and the conducting segment 202c is electrically connected with the bottom plate 404 through the via 202h'. Please note that, in order to illustrate the placement of the metal-dielectric-metal capacitor 202k more clearly, FIG. 4 further shows up the conducting segment 202b, the via 202i, and the conducting segment 202e of the layout architecture 202. Furthermore, an insulating layer may be constructed between the bottom plate 404 and the conducting segment 202e in the dielectric layer $L_{IN}$. Therefore, according to the embodiment of the present invention, the metal-dielectric-metal capacitor 202k provides another capacitive element between the first conducting path 2022 and the second conducting path 2024. Please note that, those skilled in this art will readily understand that the metal-dielectric-metal capacitor can be implemented between any two conducting layers, such as the conducting layer L6 and L5 of the above-mentioned embodiment, and can be rearranged into any appropriate shape depending on the configuration between the first conducting path 2022 and the second conducting path 2024. Besides, it is not necessary for the two conducting layers to be adjacent to each other. Since the metal-dielectric-metal capacitor is well-known to those skilled in this art, a detailed description is omitted here for brevity.

Accordingly, when the digital logic 2026 loads the current from the supply voltage Vdd at the first conducting path 2022, the energy that is stored in the capacitors C1, C2, C3, and C4 can provide the required current to the digital logic 2026 instantaneously. Therefore, the supply voltage Vdd IR drop (e.g., dynamic voltage drop) of the digital logic 2026 can be minimized. Furthermore, since the capacitors C1, C2, C3, and C4 store the energy (i.e., electric charge) in the region of the conducting layer of the semiconductor architecture, but do not utilize the substrate of the semiconductor architecture to store the energy as in the prior art, the leakage current of the layout architecture 202 of the digital circuit block 200 is much smaller than the prior art current.

Figure 5:
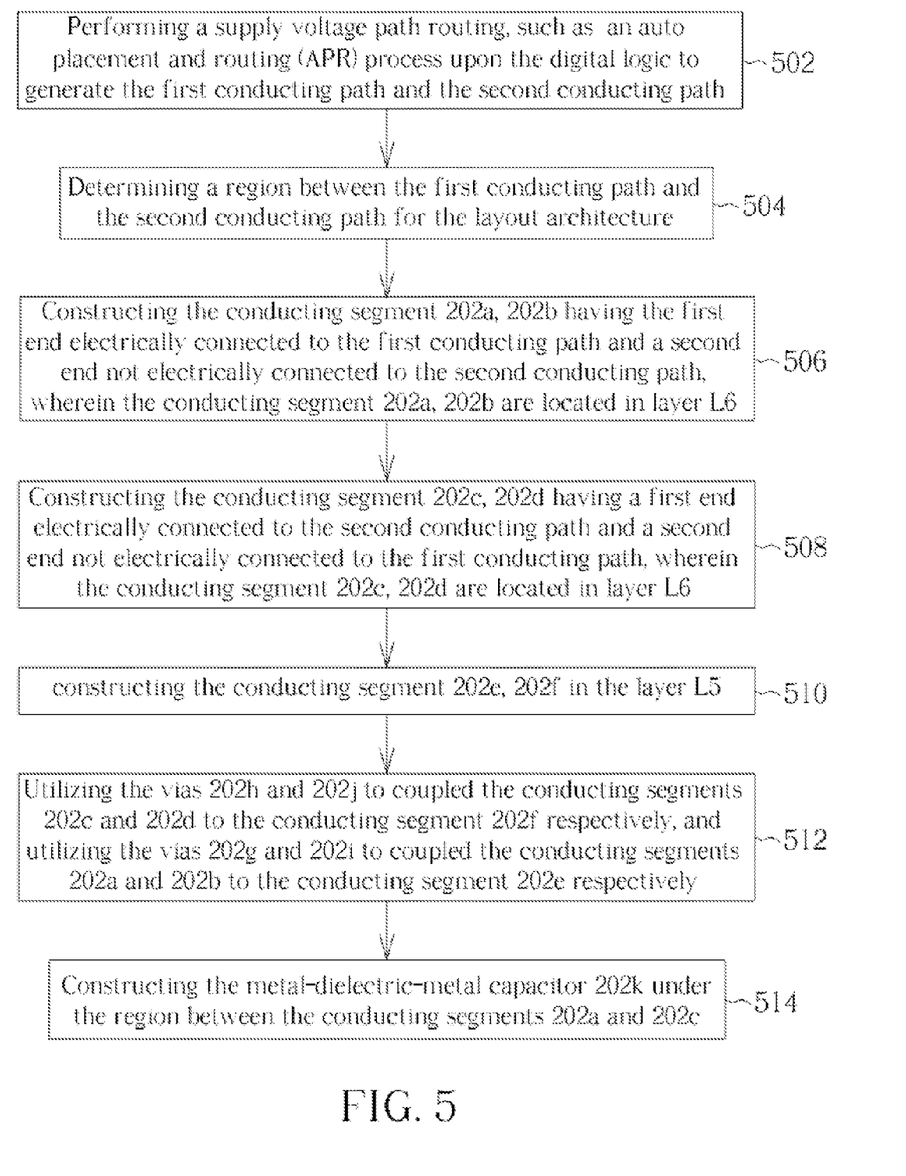
FIG. 5 is a flowchart illustrating a method for reducing a supply voltage drop in the digital circuit block of the embodiment as shown in FIG. 2.

Please refer to FIG. 5. FIG. 5 is a flowchart illustrating a method 500 for reducing the supply voltage drop in the digital circuit block 202 of the embodiment as shown in FIG. 2. Provided that substantially the same result is achieved, the steps of the flowchart shown in FIG. 5 need not be in the exact order shown, need not be contiguous, that is, other steps can be intermediate, and need not be executed completely. The method 500 comprises:

Step 502: performing a supply voltage path routing, such as an auto placement and routing (APR) process upon the digital logic 2026 to generate the first conducting path 2022 and the second conducting path 2024;

Step 504: determining a region between the first conducting path 2022 and the second conducting path 2024 for the layout architecture 202;

Step 506: constructing the conducting segment 202a, 202b having the first end electrically connected to the first conducting path 2022 and a second end not electrically connected to the second conducting path 2024, wherein the conducting segment 202a, 202b are located in layer L6;

Step 508: constructing the conducting segment 202c, 202d having a first end electrically connected to the second conducting path 2024 and a second end not electrically connected to the first conducting path 2022, wherein the conducting segment 202c, 202d are located in layer L6;

Step 510: constructing the conducting segment 202e, 202f in the layer L5;

Step 512: utilizing the vias 202h and 202j to couple the conducting segments 202c and 202d to the conducting segment 202f respectively, and utilizing the vias 202g and 202i to couple the conducting segments 202a and 202b to the conducting segment 202e respectively; and Step 514: constructing the metal-dielectric-metal capacitor 202k under the region between the conducting segments 202a and 202c.

The first conducting path 2022 may be coupled to the supply voltage Vdd and the second conducting path 2024 may be coupled to the ground voltage Vgnd (Step 502). After the APR process, one of the embodiments of the present invention may have filler capacitor cells between the region of the first conducting path 2022 and the second conducting path 2024, and it may be necessary for the method 500 to remove the filler capacitor cells first. Then, the region between the first conducting path 2022 and the second conducting path 2024 can be utilized for constructing the layout architecture 202 (Step 504). Please note that, this is just an optional step of the embodiment, and not a limitation of the present invention. In other words, the APR process may automatically provide the regions for the layout architecture 202 after performing the APR process upon the digital circuit block 200.

Please refer to FIG. 2 and FIG. 3. In step 506~512, the capacitor C1 is formed between the overlapped region of the conducting segments 202d and 202e, which is formed by a portion 202d'; and the capacitor C2 is formed between the overlapped region of the conducting segments 202b and 202f, which is formed by a portion 202b'. Furthermore, the capacitor C3 is formed between the conducting segments 202b and 202d. Similarly, the capacitor C4 is formed between the conducting segments 202e and 202f. In step 514, the metal-dielectric-metal capacitor 202k is constructed under the region between the conducting segments 202a and 202c, and comprises the conducting segment 202a, the conducting segment 202c, a top plate 402, a bottom plate 404, and a dielectric plate 406 as shown in FIG. 4. In addition, the method 500 utilizes the via 202g' to electrically connect the conducting segment 202a with the top plate 402, and utilizes the via 202h' to electrically connect the conducting segment 202c with the bottom plate 404. Therefore, the metal-dielectric-metal capacitor 202k provides another capacitive element between the first conducting path 2022 and the second conducting path 2024. Those skilled in this art will readily understand that the metal-dielectric-metal capacitor can be implemented between any two conducting layers, such as the conducting layer L6 and L5 in the above-mentioned embodiment, and can be rearranged into any appropriate shape depending on the configuration between the first conducting path 2022 and the second conducting path 2024. Besides, it is not necessary for the two conducting layers to be adjacent to each other. Since the Metal-dielectric-metal capacitor is well-known to those skilled in this art, a detailed description is omitted here for brevity.

Please note that the layout architecture 202 generated under the method 500 is just an example of the present invention, and not a limitation of the present invention. In other words, the number of the conducting segments, vias, and metal-dielectric-metal capacitors and the arrangement between the conducting segments, vias, and metal-dielectric-metal capacitors can be adjusted according to practical conditions, such as the area available for the layout architecture 202, of the implementation of the digital circuit block 202.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital circuit block having reducing supply voltage drop, comprising:
    a first conducting path having a first end coupled to a first supply voltage;
    a second conducting path having a first end coupled to a second supply voltage;
    a digital logic coupled between a second end of the first conducting path and a second end of the second conducting path;
    a first conducting layer;
    a second conducting layer;
    a third conducting layer being under the first conducting layer;
    a fourth conducting layer being between the third conducting layer and the second conducting layer;
    a dielectric layer being between the third conducting layer and the fourth conducting layer;
    a first conducting segment, having a first end electrically connected to the first conducting path, a second end not electrically connected to the second conducting path, a first portion of the first conducting segment located at the first conducting layer, and a third portion of the first conducting segment located at the third conducting layer; and
    a second conducting segment, having a first end electrically connected to the second conducting path, a second end not electrically connected to the first conducting path, a second portion of the second conducting segment located at the second conducting layer, and a fourth portion of the second conducting segment located at the fourth conducting layer;
    wherein the first portion of the first conducting segment and the second portion of the second conducting segment form a first capacitive element and the third portion of the first conducting segment, the fourth portion of the second conducting segment and the dielectric layer form a second capacitive element to reduce the supply voltage drop between the first supply voltage and the second supply voltage.

2. The digital circuit block of claim 1, wherein the first conducting segment is further configured to have a fifth portion located at the second conducting layer, whereby a third capacitive element is formed between the second portion of the second conducting segment and the fifth portion of the first conducting segment.

3. The digital circuit block of claim 2, wherein the first portion of the first conducting segment is coupled to the fifth portion of the first conducting segment through a via.

4. The digital circuit block of claim 2, wherein the second conducting segment is further configured to have a sixth portion located at the first conducting layer, whereby a fourth capacitive element is formed between the fifth portion of the first conducting segment and the sixth portion of the second conducting segment.

5. The digital circuit block of claim 4, wherein the first portion of the first conducting segment and the sixth portion of the second conducting segment form a fifth capacitive element.

6. The digital circuit block of claim 4, wherein the second portion of the second conducting segment is coupled to the sixth portion of the second conducting segment through a via.

7. The digital circuit block of claim 1, wherein one of the first supply voltage and the second supply voltage is a power supply voltage, and the other of the first supply voltage and the second supply voltage is a ground voltage.

8. The digital circuit block of claim 1, wherein the dielectric layer is an oxide layer.

9. The digital circuit block of claim 1, wherein the first conducting segment is separated from the second conducting segment.

* * * * *